US008298883B2

(12) United States Patent
Zheng et al.

(10) Patent No.: US 8,298,883 B2
(45) Date of Patent: Oct. 30, 2012

(54) METHOD OF FORMING PHOTORESIST BURR EDGE AND METHOD OF MANUFACTURING ARRAY SUBSTRATE

(75) Inventors: Yunyou Zheng, Beijing (CN); Jae Yun Jung, Beijing (CN); Zhi Hou, Beijing (CN); Zuhong Liu, Beijing (CN); Jeong Hun Rhee, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 215 days.

(21) Appl. No.: 12/503,977

(22) Filed: Jul. 16, 2009

(65) Prior Publication Data
US 2010/0012945 A1 Jan. 21, 2010

(30) Foreign Application Priority Data

Jul. 18, 2008 (CN) .......................... 2008 1 0116879

(51) Int. Cl.
*H01L 21/00* (2006.01)
*H01L 21/84* (2006.01)
(52) U.S. Cl. .................. 438/158; 257/72; 257/E21.411
(58) Field of Classification Search .................. 257/48, 257/72, E21.411, E29.273, E21.158; 438/48, 438/158, 669
See application file for complete search history.

(56) References Cited

U.S. PATENT DOCUMENTS

| 5,936,707 A * | 8/1999 | Nguyen et al. ................. 355/18 |
| 2007/0141481 A1* | 6/2007 | Kwack ............................. 430/5 |
| 2007/0148799 A1* | 6/2007 | Yang et al. ..................... 438/30 |
| 2008/0113516 A1* | 5/2008 | Takeshita et al. ............. 438/714 |
| 2008/0166838 A1* | 7/2008 | Long et al. .................... 438/151 |

FOREIGN PATENT DOCUMENTS
CN 1987622 A 6/2007
* cited by examiner

*Primary Examiner* — Tony Tran
(74) *Attorney, Agent, or Firm* — Ladas & Parry LLP

(57) ABSTRACT

A method of forming a photoresist burr edge and a method of manufacturing an array substrate are provided in the present invention. The method of manufacturing an array substrate comprises: forming a gate line and a gate electrode on a substrate; forming a data line, a source electrode, a drain electrode and a TFT channel region without removing the photoresist on the data line, the source electrode and the drain electrode; depositing a passivation layer; removing the remained photoresist and the passivation layer thereon by a lifting-off process; applying a photoresist layer; forming a photoresist burr edge of peak shape; depositing a transparent conductive film; forming a pixel electrode by a lifting-off process, wherein the pixel electrode is directly connected with the drain electrode.

6 Claims, 12 Drawing Sheets

METHOD OF FORMING PHOTORESIST BURR EDGE AND METHOD OF MANUFACTURING ARRAY SUBSTRATE

BACKGROUND

Embodiments of the present invention relate to a method of forming a photoresist burr edge and a method of manufacturing an array substrate.

Thin film transistor liquid crystal displays (TFT-LCDs) possess advantages of small volume, low power consumption, low radiation, etc., and are gradually prevailing in the market of flat plate displays. As for a TFT-LCD, an array substrate and the manufacturing method thereof control, to a large extent, the performance, yield, and price of the final products. In order to efficiently reduce the production cost of TFT-LCDs and improve the production yield thereof, the manufacturing process of a TFT-LCD array substrate is gradually simplified. Such manufacturing processes have been evolving from initial 7-mask processes to current 4-mask processes based on the slit photolithography technology. In addition, 3-mask processes are under research and development.

One 3-mask process has been proposed in Chinese patent application CN 200510132423.X, in which a gate line and a gate electrode are formed through a patterning process with a first normal mask; a data line, a source electrode, a drain electrode, and a thin film transistor (TFT) channel region are then formed through a patterning process with a second gray tone mask; and a pixel electrode is finally formed through a patterning process with a third normal mask. In this method, a normal mask is employed in the third patterning process, the sidewalls of the photoresist pattern formed by exposing and developing have a vertical topography, and the sidewalls of the passivation layer have an inwardly concaved topography with over-etching during the etching process, so that the transparent conductive thin film to be deposited subsequently is disconnected at the sidewalls of the passivation layer. However, in practice, such process requires applying a relatively thick photoresist layer to make the slope of the photoresist edge as steep as possible and preferably close to 90 degree. Unfortunately, such method practically cannot appropriately render the transparent conductive thin film disconnected at the photoresist edges. As a result, the manufacturing cost is increased, and the quality of a lifting-off process cannot be ensured. As for the TFT-LCD array substrate in preparation, any adhesion to the underlying layer of the transparent conductive thin film results in certain residual, which brings great harm to the lifting-off process and gives rise to defects to be overcome of the 3-Mask process.

SUMMARY OF THE INVENTION

A method of forming a photoresist burr edge is provided in an embodiment of the present invention, and the method comprises the steps of applying a photoresist layer on a substrate and forming by exposing with a mask and developing a photoresist burr edge that is capable of disconnecting a structural layer to be deposited subsequently.

A method of forming a structural pattern is further provided in an embodiment of the present invention, and the method comprises: forming a photoresist layer with a photoresist burr edge on a substrate by using the above method of forming a photoresist burr edge; depositing a structural layer on the substrate; and lifting-off the photoresist layer and the structural layer thereon to form the structural pattern.

A method of manufacturing an array substrate is further provided in an embodiment of the present invention, and the method comprises: forming a gate line and a gate electrode on a substrate; forming a data line, a source electrode, a drain electrode and a TFT channel region on the substrate without removing the photoresist on the data line, the source electrode and the drain electrode, depositing a passivation layer, and then removing the remained photoresist and the passivation layer thereon together by a lifting-off process; and applying a photoresist layer on the substrate, forming a photoresist burr edge of peak shape by using the method of forming a photoresist burr edge according to one of claim 1 to claim 7, depositing a transparent conductive film, removing the photoresist and the transparent conductive film thereon together by a lifting-off process to form a pixel electrode, wherein the pixel electrode is directly connected with the drain electrode.

An array substrate is further provided in an embodiment of the present invention, the array substrate comprises: a plurality of gate lines and a plurality of data lines, which are intersecting with each to define a plurality of pixel units. A pixel electrode formed in each pixel unit and a thin film transistor formed at the intersection of each pixel unit. The thin film transistor comprises a gate electrode on a substrate, a gate insulating layer on the gate electrode and covering the entire substrate, a semiconductor layer and a doped semiconductor layer on the gate insulating layer, a source electrode and a drain electrode on the doped semiconductor layer, a TFT channel region between the source electrode and the drain electrode, and a passivation layer formed in the region other than the regions where the data line, the source electrode and the drain electrode are formed. The pixel electrode is connected with the drain electrode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE EMBODIMENTS

A method of forming a photoresist burr edge according to the embodiments of the present invention comprises:
step 100 of applying a photoresist layer on a substrate; and
step 200 of forming by exposing with a mask and developing a photoresist burr edge that is capable of disconnecting a structural layer to be deposited subsequently.

In the embodiments of the present invention, the substrate may have a structural pattern such as a data line, a source electrode, a drain electrode and a thin film transistor (TFT) channel region formed on the substrate. The photoresist burr edge can disconnect (or cut off) the structural layer to be deposited thereon subsequently for forming other structural pattern. For example, in the case of forming a pixel electrode, when a transparent conductive film is deposited on the photoresist layer, the film can be disconnected at the protrusion of the photoresist burr edge, that is, the transparent conductive films on both sides of the photoresist burr edge are separated (disconnected) from each other, and then the pixel electrode can be formed by a lifting-off process.

A first embodiment of the method of forming a photoresist burr edge of the present invention comprises:
step 210 of applying a photoresist layer on a substrate; and
step 211 of forming a first thickness region, a second thickness region and a third thickness region of the photoresist layer by exposing with a gray tone mask or a half-tone mask and developing, wherein the first thickness region of the photoresist layer has a photoresist ridge and corresponds to the region where the photoresist burr edge is to be formed, the second thickness region of the photoresist layer corresponds to the region where no structural pattern is to be formed, and the third thickness region corresponds to the region where a structural pattern is to be formed; and
step 212 of forming a photoresist burr edge of peak shape in the first thickness region, remaining the photoresist in the second thickness region and completely removing the photoresist in the third thickness region by an ashing process.

Figure 1:
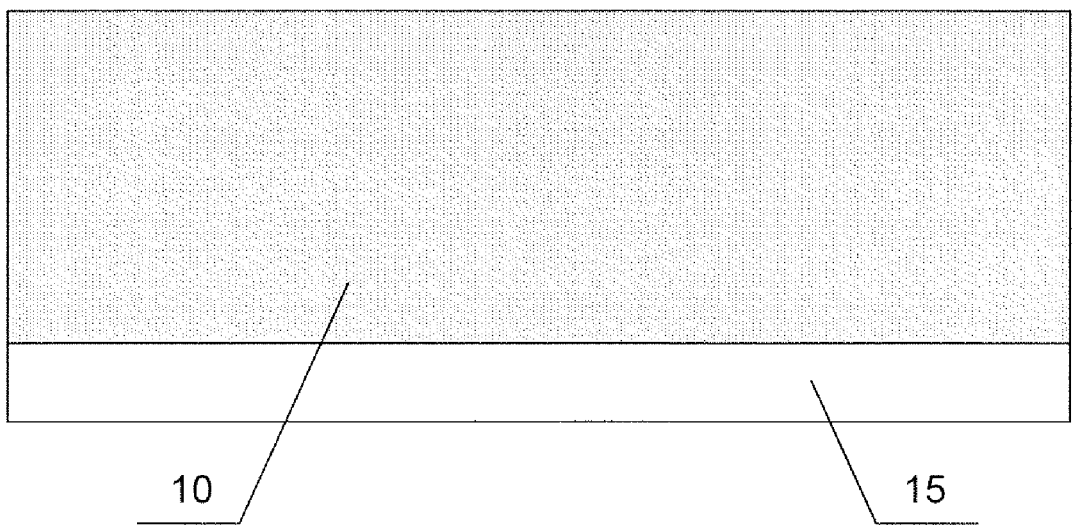
FIG. 1 is a schematic view after applying a photoresist layer according to a first embodiment of a method of forming a photoresist burr edge of the present invention.
Figure 2:
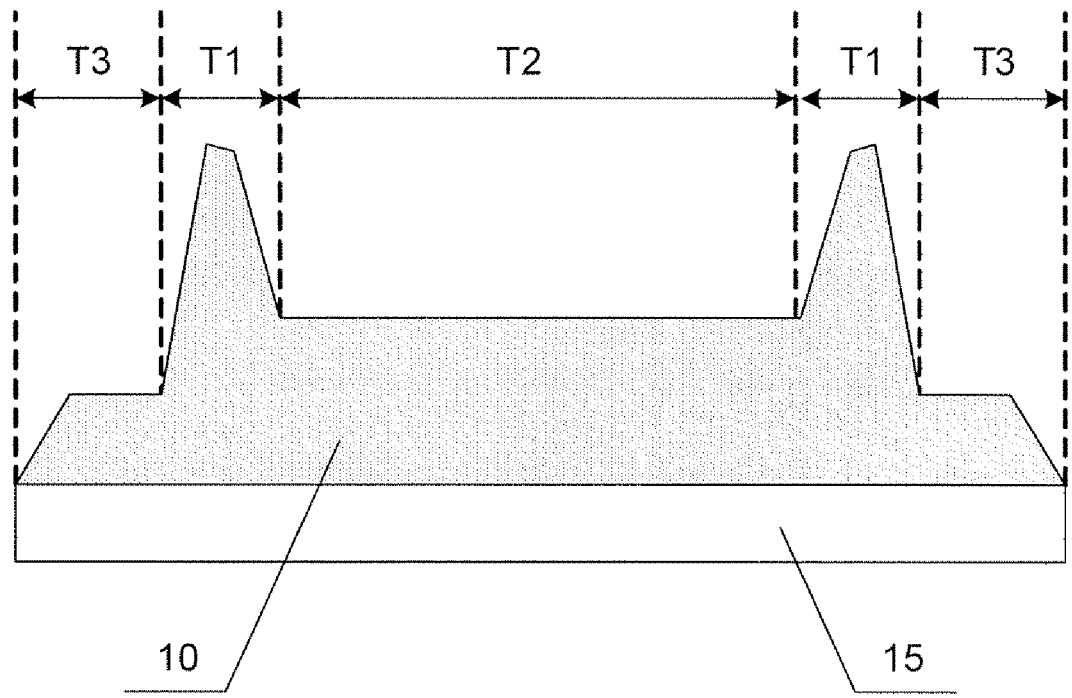
FIG. 2 is a schematic view after an exposing and developing process according to the first embodiment of the method of forming a photoresist burr edge of the present invention.
Figure 3:
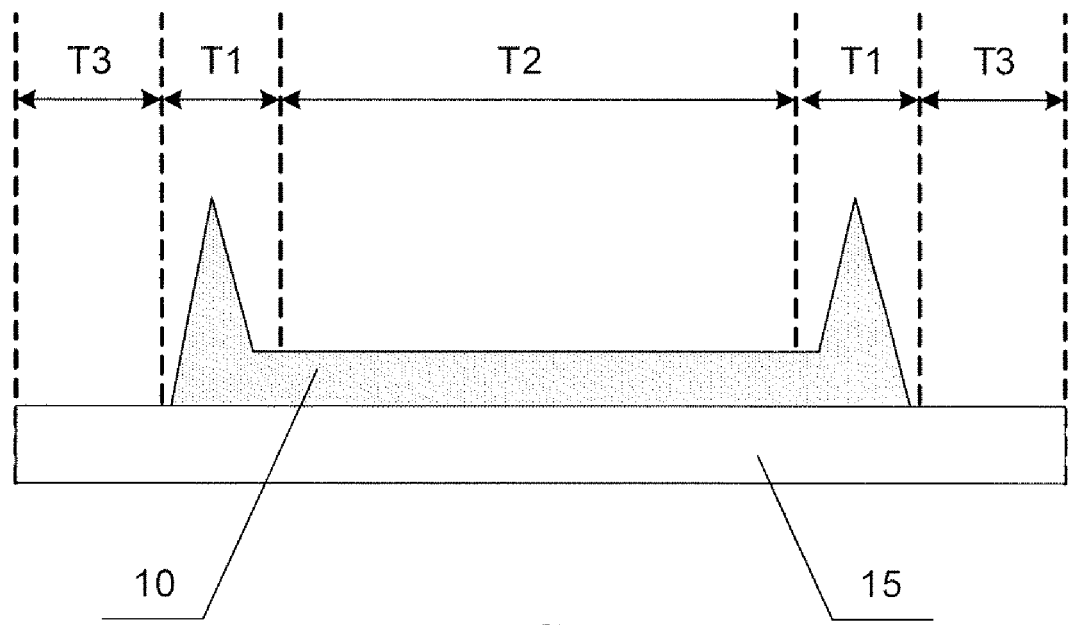
FIG. 3 is a schematic view after an ashing process according to the first embodiment of the method of forming a photoresist burr edge of the present invention.

FIG. 1 to FIG. 3 are schematic views according to the first embodiment of the method of forming a photoresist burr edge of the present invention. In this embodiment, for example, a positive photoresist is used.

FIG. 1 is a schematic view after applying a photoresist layer according to the first embodiment of the method of forming a photoresist burr edge. As shown in FIG. 1, a photoresist layer 10 is applied on the substrate 15 with certain structural pattern. The thickness of the photoresist layer 10 is about 1.8 μm to about 2.2 μm, and preferably about 2.0 μm.

FIG. 2 is a schematic view after an exposing and developing process according to the first embodiment of the method of forming a photoresist burr edge. An exposing process is performed with a gray tone mask or a half-tone mask so that the photoresist layer is formed into a first exposed region (a first thickness region of the photoresist layer) T1, a second exposed region (a second thickness region of the photoresist layer) T2, and a third exposed region (a third thickness region of the photoresist layer) T3. The first exposed region T1 is an un-exposed region and corresponds to the region where the photoresist burr edge is to be formed; the second exposed region T2 is a slightly exposed region and corresponds to the region where no structural pattern is to be formed; and the third exposed region T3 is a heavily exposed region and corresponds to the region where a structural pattern is to be formed. Specifically, for example, in the case of forming a pixel electrode, the first exposed region T1 corresponds to the peripheral region of the pixel electrode, the second exposed region T2 corresponds to the region where no pixel electrode is to be formed, and the third exposed region T3 corresponds to the region where the pixel electrode is to be formed. As for the gray-tone mask, for example, the opaque region thereof corresponds to the first exposed region T1 and has a transmissivity of about 0%, the slightly transparent region thereof corresponds to the second exposed region T2 and has a transmissivity of about 10%~40%, and the heavily transparent region thereof corresponds to the third exposed region T3 and has a transmissivity of about 60%~90%. After forming the three kinds of regions, the thicknesses of the photoresist in the three regions are changed by a developing process to be different from each other. Specifically, the thickness of the photoresist in the first exposed region T1 is the largest, the thickness of the photoresist in the third exposed region T3 is the smallest, and the thickness of the photoresist in the second exposed region T2 is reduced to be between the thickness of the photoresist in the first exposed region T1 and that in the third exposed region T3. As shown in FIG. 2, a photoresist ridge is formed in the first exposed region T1. If the thickness of the applied photoresist is about 1.8 µm to about 2.2 µm and preferably about 2.0 µm, the thickness of the photoresist in the first exposed region T1 after the developing process is still about 1.8 µm to about 2.2 µm and preferably about 2.0 µm, the thickness of the photoresist in the second exposed region T2 after the developing process is about 1.3 µm to about 1.6 µm and preferably about 1.5 µm, and the thickness of the photoresist in the third exposed region T3 after the developing process is about 0.4 µm to about 0.6 µm and preferably about 0.5 µm.

FIG. 3 is a schematic view after an asking process according to the first embodiment of the method of forming a photoresist burr edge. As shown in FIG. 3, the thickness of the photoresist in the first exposed region T1 is reduced and a photoresist peak is formed in this region, the thickness of the photoresist in the second exposed region T2 is further reduced, and the photoresist in the third exposed region T3 is completely removed. If the thickness of the applied photoresist is about 1.8 µm to about 2.2 µm and preferably about 2.0 µm, the thickness of the photoresist in the second exposed region T2 after the ashing process is about 0.9 µm to about 1.1 µm and preferably about 1.0 µm, and no photoresist exists in the third exposed region T3.

A second embodiment of a method of forming a photoresist burr edge of the present invention comprises:

step 220 of applying a photoresist layer on a substrate;

step 221 of forming a completely remained region and a completely removed region of the photoresist layer by exposing with a normal mask and developing, wherein the completely remained region corresponds to the region where no structural pattern is to be formed, and the completely removed region corresponds to the region where a structural pattern is to be formed and the photoresist in this region is removed completely; and step 222 of dry-etching the photoresist layer by using dual cathode coupling plasma mode and setting the etching rate to be higher at the central portion of the photoresist layer and to be lower at the edge portion of the photoresist layer by setting the high-frequency and low-frequency power, the flux of the etching gas, the gas pressure, and the temperature of each wall of the etching chamber, so that a photoresist burr edge of peak shape is formed.

FIG. 4 to FIG. 6a are schematic views according to the second embodiment of the method of forming a photoresist burr edge of the present invention. In this embodiment, for example, a positive photoresist is used.

Figure 4:
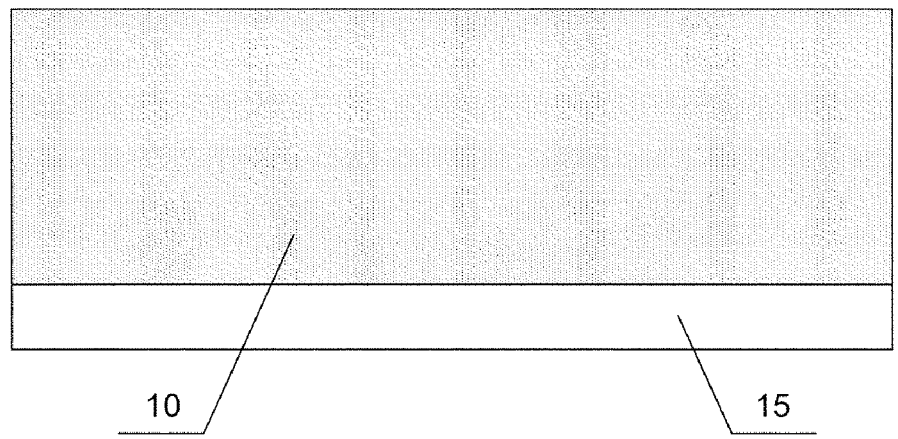
FIG. 4 is a schematic view after applying a photoresist layer according to a second embodiment of a method of forming a photoresist burr edge of the present invention.
Figure 5:
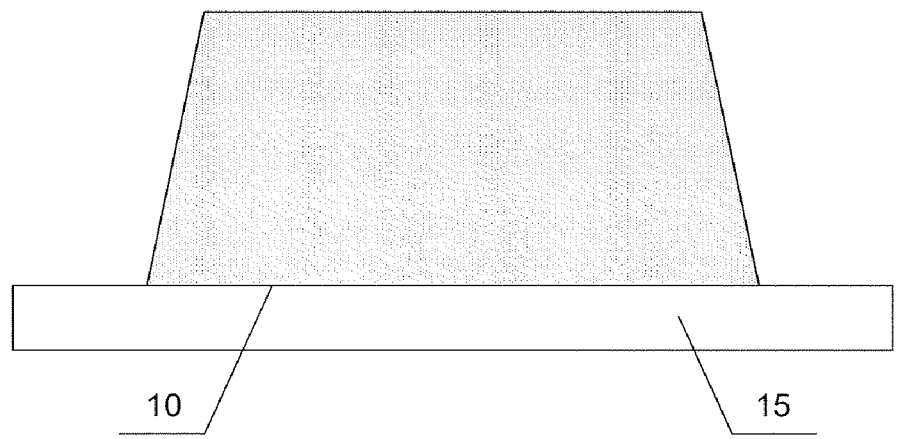
FIG. 5 is a schematic view after an exposing and developing process according to the second embodiment of the method of forming a photoresist burr edge of the present invention.

FIG. 4 is a schematic view after applying a photoresist layer according to the second embodiment of the method of forming a photoresist burr edge. As shown in FIG. 4, a photoresist layer 10 is applied on the substrate 15 with certain structural pattern. FIG. 5 is a schematic view after exposing and developing according to the second embodiment of the method of forming a photoresist burr edge. An exposing process is performed with a normal mask so that the photoresist layer is formed into an unexposed region (i.e., a region where the photoresist is to be remained completely) and a completely exposed region (i.e., a region where the photoresist is to be removed completely). The unexposed region corresponds to the region where no structural pattern is to be formed and the completely region corresponds to the region where a structural pattern is to be formed. For example, in the case of forming a pixel electrode, the un-exposed region corresponds to the region where no pixel electrode is to be formed and the completely exposed region corresponds to the region where the pixel electrode is to be formed. Then, the photoresist in the completely exposed region is completely removed after developing.

Figure 6A:
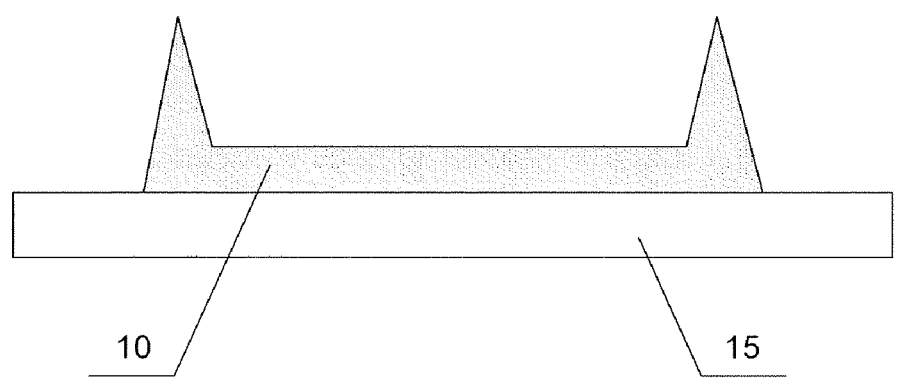
FIG. 6a is a schematic view after an etching process according to the second embodiment of the method of forming a photoresist burr edge of the present invention.
Figure 6B:
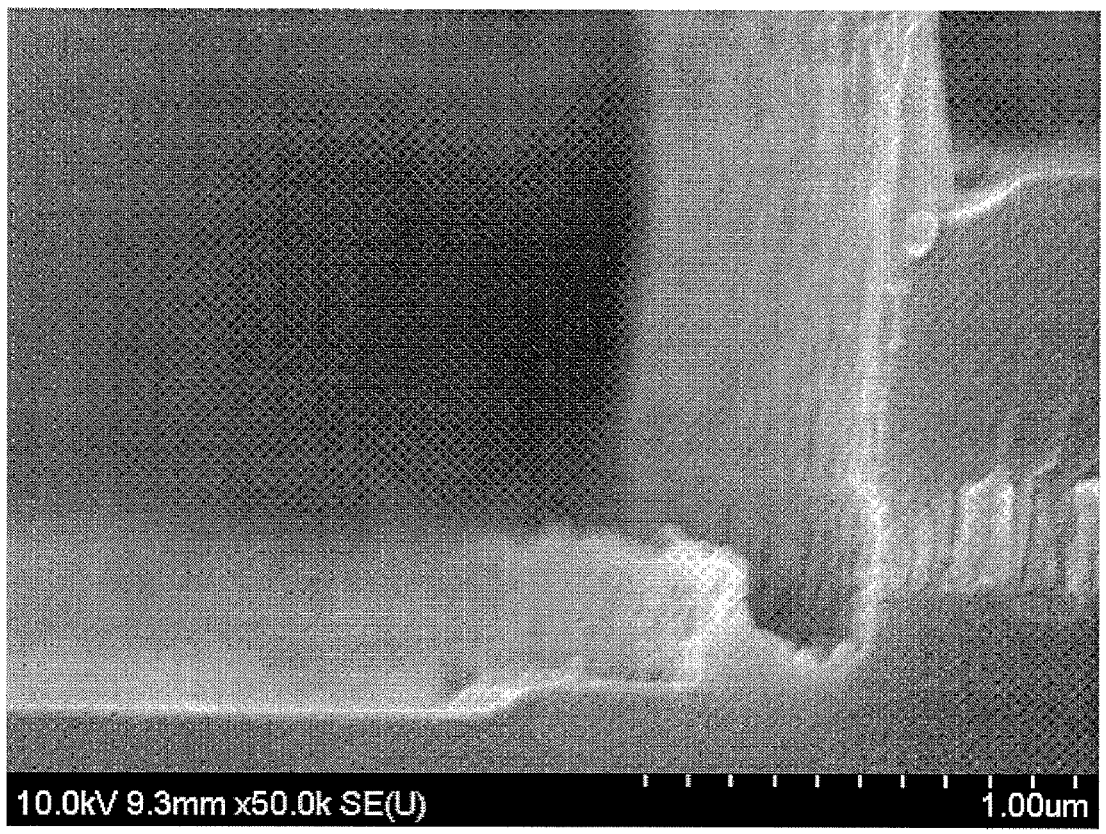
FIG. 6b shows a scanning electron microscope (SEM) image of the etched photoresist.

FIG. 6a is a schematic view after an etching process according to the second embodiment of the method of forming a photoresist burr edge, and FIG. 6b shows a scanning electron microscope (SEM) image of the etched photoresist. In the etching process, the photoresist burr edge of peak shape is formed by setting the parameters of the etching process. In the embodiment, for example, the photoresist layer is dry-etched by using dual cathode coupling plasma mode and the etching rate is adjusted to be higher at the central portion of the photoresist layer and to be lower at the edge portion of the photoresist layer by setting the high-frequency and low-frequency power, the flux of the etching gas, the gas pressure, and the temperature of each wall of the etching chamber, so that a photoresist burr edge of peak shape is finally formed. For example, When using G5 size dry etcher, the etching gas may comprise $CH_3F$ or $SF_6$ and $O_2$ at the flux of 50~3000 sccm; the high frequency is selected as no less than 13.56 MHz, and the low frequency is selected as no higher than 10 MHz; the source and bias power is 1~10 KW; the gas pressure is adjusted to 50~200 mtorr; and the temperatures of the top, bottom, and sidewalls of the chamber are set to be 30~80° C., respectively.

In the above-described embodiments, due to the formation of the photoresist burr edge, the structural layer to be deposited subsequently can be disconnected at the protrusion of the photoresist burr edge, that is, the structural layer on both sides of the photoresist burr edge can be disconnected from each other. In the following lifting-off process, the structural layer deposited on the photoresist layer is removed together with the remained photoresist, and thus the structural layer outside the region of the remained photoresist is remained to form the intended structural pattern.

According to the method of forming a photoresist burr edge of the present invention, the photoresist burr edge is formed, the structural layer to be deposited subsequently is disconnected at the protrusion of the photoresist burr edge, and thereby desired structural pattern can be formed by following lifting-off process or the like. Therefore, the method of forming a photoresist burr edge in the present invention can reliably ensure the quality of the photoresist lifting-off process.

In practice, the embodiment of the method of forming a photoresist burr edge of the present invention may be used in the lifting-off process for preparing various structural patterns, and also may be directly used to form structural patterns, thereby the method has a wide application. In the present invention, the embodiment of the method of forming a structural pattern can comprise the steps of applying the photoresist, forming the photoresist burr edge of peak shape, depositing the structural layer, and forming the structural pattern by a lifting-off process. Specifically, the structural pattern may be a pattern of a gate line and a gate electrode, a data line, a source electrode, a drain electrode, a TFT channel region or a pixel electrode.

For example, in the case of forming the patterns of a gate line and a gate electrode, a photoresist layer is firstly deposited on a substrate, and then a photoresist burr edge is formed by using the embodiment of the method in the present invention. There is no photoresist in the region where the gate line and the gate electrode is to be formed the photoresist burr edge is formed in the edge portion of the region where the photoresist is remained. Then a gate metal film is deposited, and finally the remained photoresist and the gate metal film thereon are removed together by a lifting-off process so that the gate line and the gate electrode is formed on the substrate. In addition, for example, in the case of forming the patterns of a data line, a source electrode, a drain electrode and a TFT channel region, a photoresist layer is firstly deposited on a substrate, which are provided with the patterns of a gate line and a gate electrode and are sequentially deposited with a gate insulating layer, a semiconductor layer and a doped semiconductor layer, then a photoresist burr edge is formed by using the method in the embodiment of the present invention so that there is no photoresist in the region where the data line, the source electrode, the drain electrode and the TFT channel region is to be formed and the photoresist burr edge is formed in the edge portion of the region where the photoresist is remained, then a metal film for source and drain electrodes is deposited, and finally the remained photoresist and the metal film for source and drain electrodes thereon are removed by a lifting-off process so that the data line, the source electrode, the drain electrode and the TFT channel region are formed on the substrate. Furthermore, for example, in the case of forming the pattern of a pixel electrode, a photoresist layer is firstly deposited on a substrate provided with a gate electrode, a source electrode, a drain electrode and a passivation layer, then a photoresist burr edge is formed by using the method in the embodiment of the present invention so that there is no photoresist in the region where the pixel electrode is to be formed and the photoresist burr edge is formed in the edge portion of the region where the photoresist is remained, then a transparent conductive film is deposited, and finally the remained photoresist and the transparent conductive film thereon are removed by a lifting-off process so that the pixel electrode is formed on the substrate. In addition, similarly, an insulating layer via hole may be formed by using the method of the embodiment of forming a photoresist burr edge of the present invention.

A method of forming a TFT-LCD array substrate according to the embodiments of the present invention comprises:

step 1 of forming a gate line and a gate electrode on a substrate;

step 2 of forming a data line, a source electrode, a drain electrode and a TFT channel region on the substrate after step 1 without removing the photoresist on the data line, the source electrode and the drain electrode, depositing a passivation layer, and then removing the remained photoresist and the passivation layer thereon together by a lifting-off process; and step 3 of applying a photoresist layer on the substrate after step 2, forming a photoresist burr edge of peak shape, then depositing a transparent conductive film and forming a pixel electrode by a lifting-off process, wherein the pixel electrode is directly connected with the drain electrode.

A first embodiment of a method of manufacturing a TFT-LCD array substrate of the present invention comprises:

step 11 of depositing a gate metal film on a substrate, and forming a gate line and a gate electrode by a first patterning process with a normal mask;

step 12 of depositing a gate insulating layer, a semiconductor layer, a doped semiconductor layer and a metal film for source and drain electrodes in this order on the substrate after step 11, forming a data line, a source electrode, a drain electrode and a TFT channel region with a gray tone mask or a half-tone mask by a second patterning process without removing the photoresist on the source electrode, the drain electrode and the data line, depositing a passivation layer on the substrate to cover the TFT channel region, then removing the remained photoresist and the passivation layer thereon together by a lifting-off process to expose the underlying source electrode, the drain electrode and the data line; and step 13 of applying a photoresist layer on the substrate after step 12, forming a photoresist burr edge of peak shape, depositing a transparent conductive film so that the transparent conductive film is disconnected at the protrusion of the photoresist burr edge, removing the photoresist and the transparent conductive film thereon together by a lifting-off process so that a pixel electrode directly connected with the drain electrode is formed.

FIG. 7 to FIG. 12 are schematic views according to the first embodiment of the method of manufacturing a TFT-LCD array substrate of the present invention. For example, the TFT-LCD array substrate obtained in the present embodiment is a Twist Nematic (TN) mode TFT-LCD. In the description hereinafter, a patterning process generally comprises the steps of applying a photoresist layer, exposing and developing the photoresist layer, etching an underlying layer, lifting-off the photoresist layer or the like, and for example, a positive photoresist is used.

Figure 7:
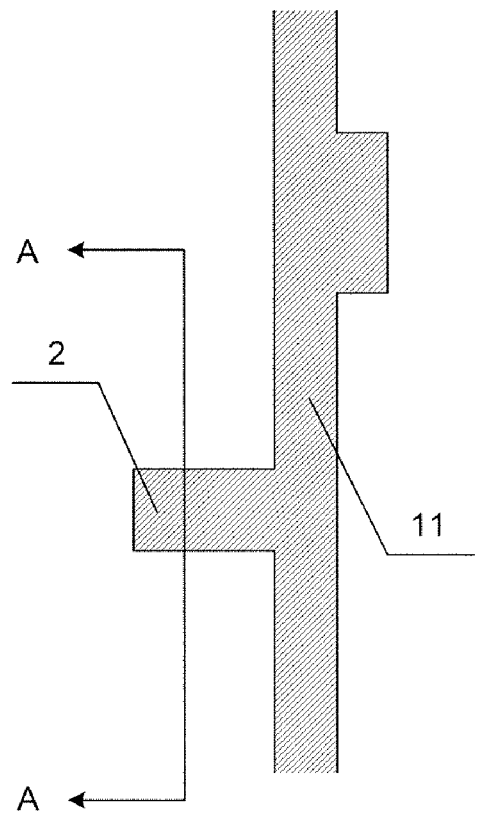
FIG. 7 is a plane view after a first patterning process according to a first embodiment of a method of manufacturing a TFT-LCD array substrate of the present invention.
Figure 8:
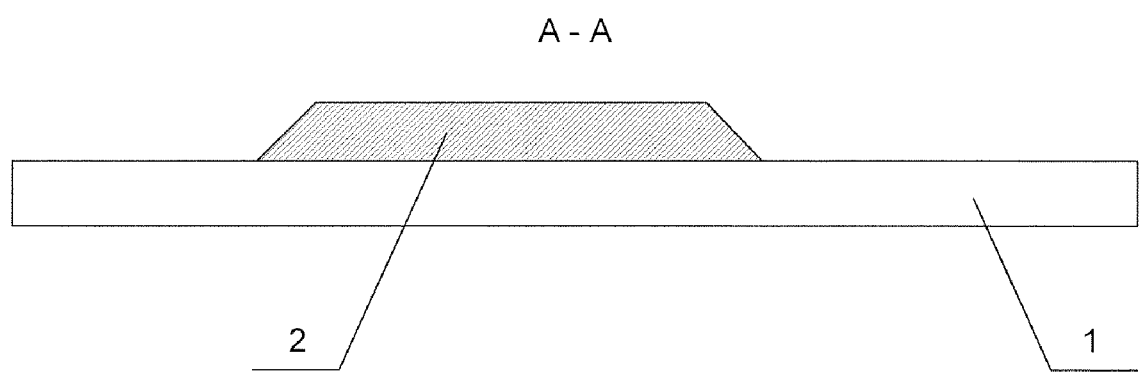
FIG. 8 is a sectional view taken along a line A-A in FIG. 7.

FIG. 7 is a plane view after a first patterning process according to the first embodiment of the method of manufacturing a TFT-LCD array substrate, and FIG. 8 is a sectional view taken along a line A-A in FIG. 7. A gate metal film is deposited on a substrate 1 (e.g., a glass substrate or a quartz substrate) for example by a magnetron sputtering method, a thermal evaporation method or the like. The gate metal film may be a single layer of molybdenum, aluminum, aluminum neodymium alloy, tungsten, chromium, copper or the like or a multilayer of two or more metals selected form above-mentioned metals. The gate metal film is patterned with a normal mask by a first patterning process so that a gate line 11 and a gate electrode 12 are formed on the substrate, as shown in FIG. 7 and FIG. 8.

Figure 9:
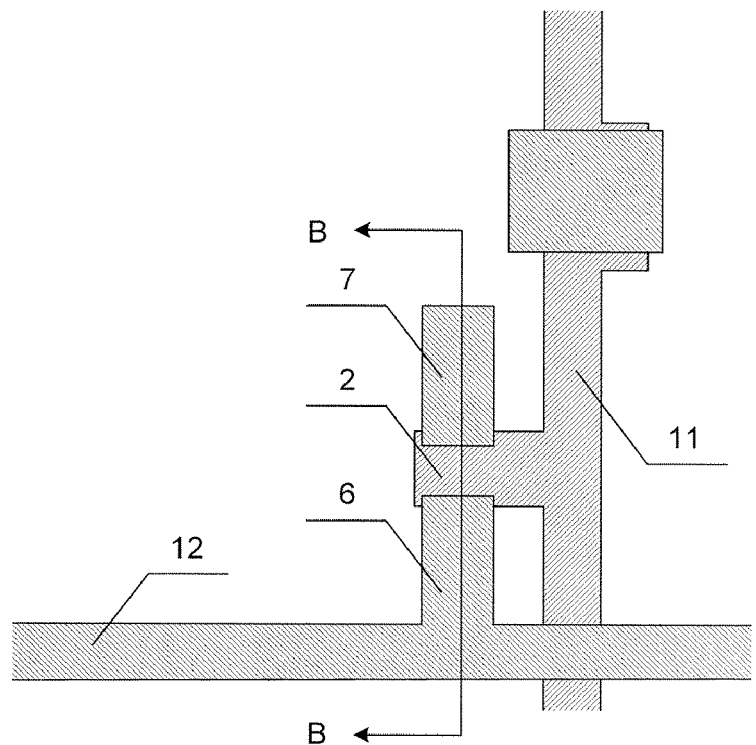
FIG. 9 is a plane view after a second patterning process according to the first embodiment of the method of manufacturing a TFT-LCD array substrate of the present invention.
Figure 10:
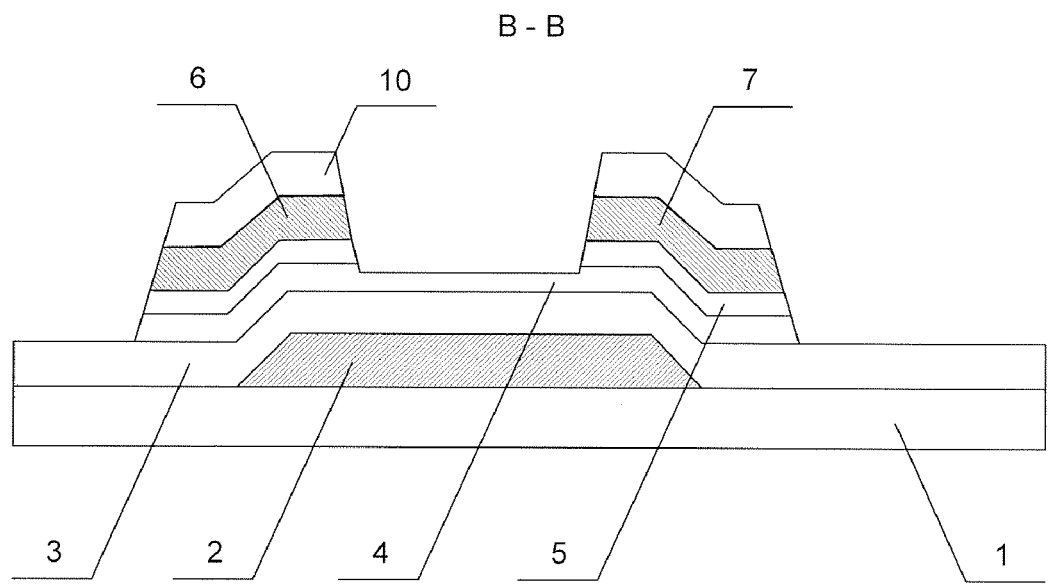
FIG. 10 is a schematic view after forming a data line, a source electrode, a drain electrode and a TFT channel region in the second patterning process according to the first embodiment of the method of manufacturing a TFT-LCD array substrate of the present invention.

FIG. 9 is a plane view after a second patterning process according to the first embodiment of the method of manufacturing a TFT-LCD array substrate. A gate insulating layer 3, a semiconductor layer 4, and a doped semiconductor layer (i.e., an ohmic contact layer) 5 are deposited in this order on the substrate with the above patterns for example by a chemical vapor deposition method or the like. The semiconductor layer 4 and the doped semiconductor layer 5 constitute an active layer. Then, a metal film for source and drain electrodes is deposited for example by a magnetron sputtering method, a thermal evaporation method or the like. The metal film for source and drain electrodes may be a single layer of molybdenum, aluminum, aluminum neodymium alloy, tungsten, chromium, copper or the like or a multilayer of two or more metals selected form above-mentioned metals. FIG. 10, which is taken along a line B-B in FIG. 9, is a schematic view after forming a data line, a source electrode, a drain electrode and a TFT channel region in the second patterning process according to the first embodiment of the method of manufacturing a TFT-LCD array substrate.

The semiconductor layer, the doped semiconductor layer and the metal film for source and drain electrodes are patterned with a gray tone mask or a half-tone mask by the second patterning process so that a data line 12, a source electrode 6, a drain electrode 7 and a TFT channel region are formed on the substrate. The pattern of the active layer is formed above the gate electrode 2. The doped semiconductor layer between the source electrode 6 and the drain electrode 7 is completely removed to expose the semiconductor layer therebetween and the gate insulating layer is exposed in other regions. As shown in FIG. 9 and FIG. 10, the photoresist on the source electrode 6, the drain electrode 7 and the data line 12 is remained. In addition, since the process of forming a data line, a source electrode, a drain electrode and a TFT channel region with a gray tone mask or a half-tone mask is widely used in current 4-mask processes, the details thereof are not explained again for simplicity.

Figure 11:
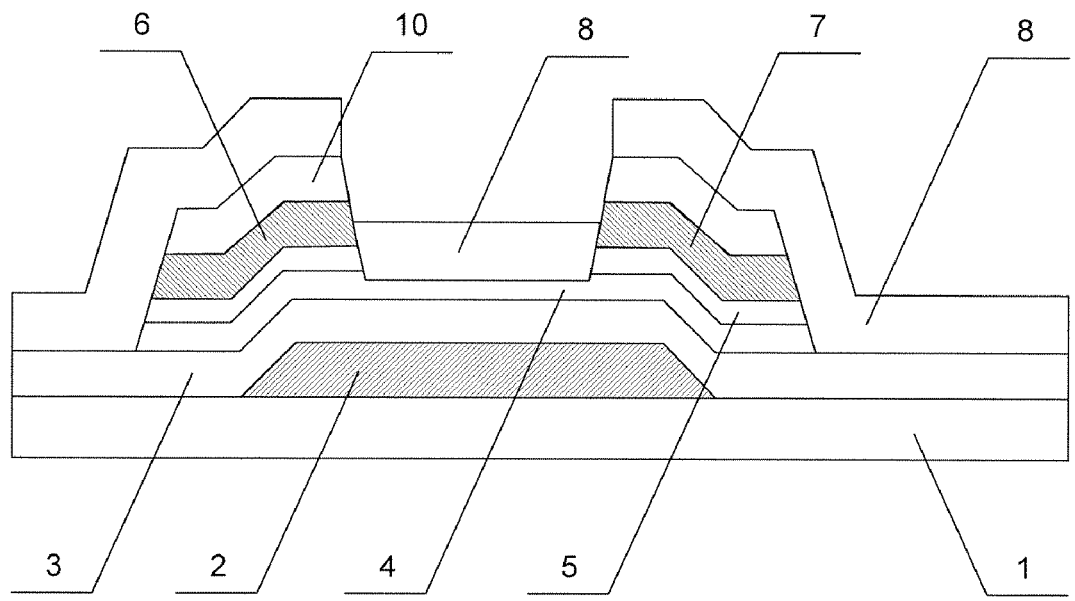
FIG. 11 is a schematic view after depositing a passivation layer in the second patterning process according to the first embodiment of the method of manufacturing a TFT-LCD array substrate of the present invention.

FIG. 11, which is taken along the line B-B in FIG. 9, is a schematic view after depositing a passivation layer in the second patterning process according to the first embodiment of the method of manufacturing a TFT-LCD array substrate. As shown in FIG. 11, the photoresist 10 on the source electrode 6, the drain electrode 7 and the data line 12 is remained and a passivation layer 8 is deposited for example by a chemical vapor deposition method or the like to cover the TFT channel region.

Figure 12:
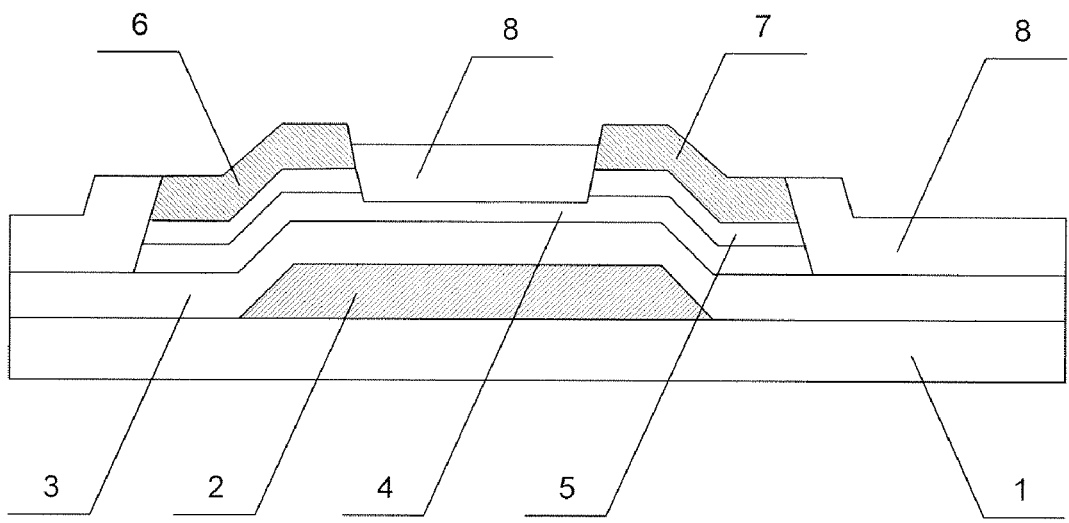
FIG. 12 is a schematic view after lifting-off photoresist in the second patterning process according to the first embodiment of the method of manufacturing a TFT-LCD array substrate of the present invention.

FIG. 12, which is taken along the line B-B in FIG. 9, is a schematic view after lifting-off photoresist in the second patterning process according to the first embodiment of the method of manufacturing a TFT-LCD array substrate. As shown in FIG. 12, the remained photoresist along with the passivation layer thereon is removed by a lifting-off process so that the source electrode, the drain electrode and the data line are exposed. In addition, the method of forming a photoresist burr edge in the embodiments may be employed to form a photoresist burr edge before depositing the passivation layer in order that the remained photoresist along with the passivation layer thereon can be removed easily.

Figure 13:
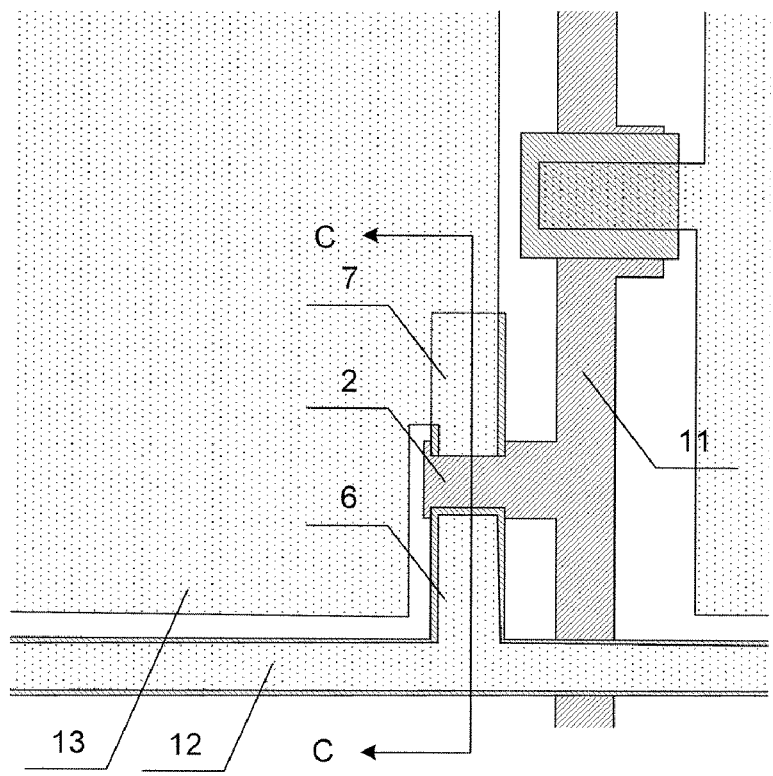
FIG. 13 is a plane view after a third patterning process according to the first embodiment of the method of manufacturing a TFT-LCD array substrate of the present invention.
Figure 14:
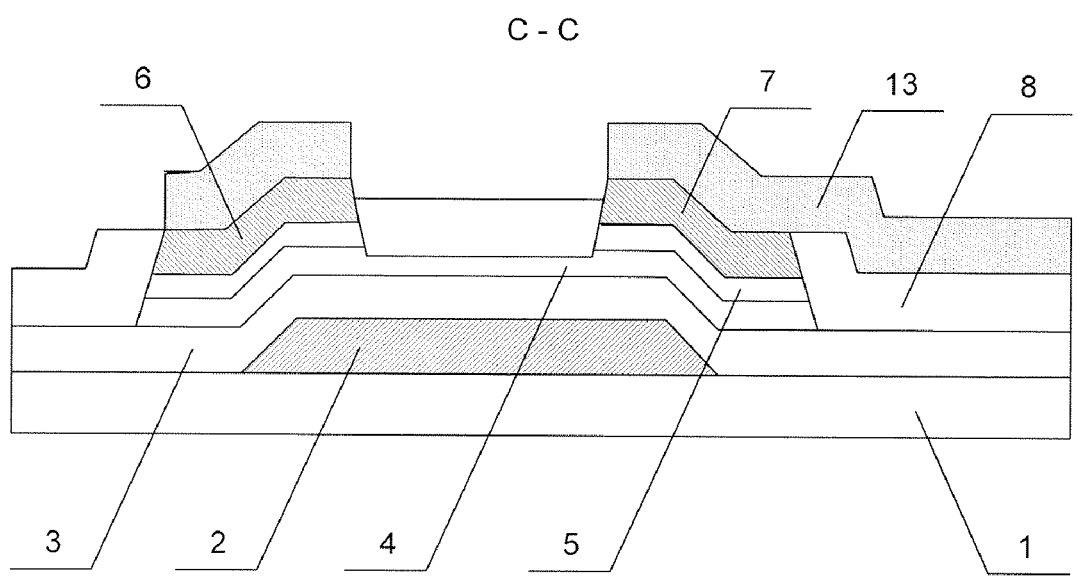
FIG. 14 is a sectional view taken along a line C-C in FIG. 13.

FIG. 13 is a plane view after a third patterning process according to the first embodiment of the method of manufacturing a TFT-LCD array substrate, and FIG. 14 is a sectional view taken along a line C-C in FIG. 13. A photoresist layer is applied on the substrate with the above-described patterns. The thickness of the photoresist layer is about 1.8 µm to about 2.2 µm and preferably about 2.0 µm. An exposing process is performed with a gray tone mask or a half-tone mask so that the photoresist layer is formed into a first exposed region (a first thickness region of the photoresist layer), a second exposed region (a second thickness region of the photoresist layer), and a third exposed region (a third thickness region of the photoresist layer). The first exposed region is an unexposed region and corresponds to the region where the photoresist burr edge is to be formed; the second exposed region is a slightly exposed region and corresponds to the region where no pixel electrode is to be formed; and the third exposed region is a heavily exposed region and corresponds to the region where a pixel electrode is to be formed. As for the gray-tone mask or half-tone mask, the opaque region thereof corresponds to the first exposed region and has a transmissivity of about 0%, the slightly transparent region thereof corresponds to the second exposed region and has a transmissivity of about 10%~40%, and the heavily transparent region thereof corresponds to the third exposed region and has a transmissivity of about 60%~90%. After forming the three kinds of regions, the thicknesses of the photoresist in the three regions are changed by a developing process to be different from each other. Specifically, the thickness of the photoresist in the first exposed region is still about 1.8 µm to about 2.2 µm and preferably about 2.0 µm, which is the largest; the thickness of the photoresist in the second exposed region is reduced to about 1.3 µm to about 1.6 µm and preferably about 1.5 µm; and the thickness of the photoresist in the third exposed region is about 0.4 µm to about 0.6 µm and preferably about 0.5 µm, which is the smallest. Then, an ashing process is performed so that the photoresist burr edge is formed in the first exposed region, the thickness of the photoresist in the second exposed region is further reduced to about 0.9 µm to about 1.1 µm and preferably about 1.0 µm, and the photoresist in the third exposed region is completely removed. Then, a transparent conductive film of indium tin oxide (ITO), indium zinc oxide (IZO) or the like is deposited on the above patterned photoresist. The thickness of the transparent conductive film is about 300 Å to about 500 Å and preferably about 400 Å. Due to the photoresist burr edge, the transparent conductive film is disconnected at the protrusion of the photoresist burr edge, that is, the transparent conductive film on both sides of the photoresist burr edge is disconnected. Finally, the remained photoresist along with the transparent conductive film thereon is removed by a lifting-off process so that the pixel electrode 13 is formed on the substrate. As shown in FIG. 13 and FIG. 14, the pixel electrode 13 and the drain electrode 8 are directly connected with each other.

In the third patterning process of the present embodiment, the photoresist burr edge is formed for example by the method shown in FIG. 1 to FIG. 3. However, the photoresist burr edge may also be formed by the method shown in FIG. 4 to FIG. 6a. In addition, the method of forming a photoresist burr edge may be employed in the first and second patterning processes of the present embodiment of the method of manufacturing a TFT-LCD array substrate as necessary.

A second embodiment of a method of manufacturing a TFT-LCD array substrate of the present invention comprises:

step 21 of depositing a transparent conductive film and a gate metal film in this order on a substrate, and then forming a gate line, a gate electrode and a transparent common electrode with a gray tone mask or a half-tone mask by a first patterning process;

step 22 of depositing a gate insulating layer, a semiconductor layer, a doped semiconductor layer and a metal film for source and drain electrodes in this order on the substrate after step 21, forming a data line, a source electrode, a drain electrode and a TFT channel region with a gray tone mask or a half-tone mask by a second patterning process without removing the photoresist on the source electrode, the drain electrode and the data line, depositing a passivation layer to cover the TFT channel region, removing the remained photoresist and the passivation layer thereon by a lifting-off process to expose the source electrode, the drain electrode and the data line; and step 23 of applying a photoresist layer on the substrate after step 22, forming a photoresist burr edge of peak shape, depositing a transparent conductive film so that the transparent conductive film is disconnected at the protrusion of the photoresist burr edge, removing the photoresist and the transparent conductive film thereon together by a lifting-off process so that a pixel electrode directly connected with the drain electrode is formed.

FIG. 15 to FIG. 22 are schematic views according to the second embodiment of the method of manufacturing a TFT-LCD array substrate of the present invention. For example, the TFT-LCD array substrate obtained in the present embodiment is a field fringe switch (FFS) mode TFT-LCD. In the present embodiment, for example, a positive photoresist is used.

Figure 15:
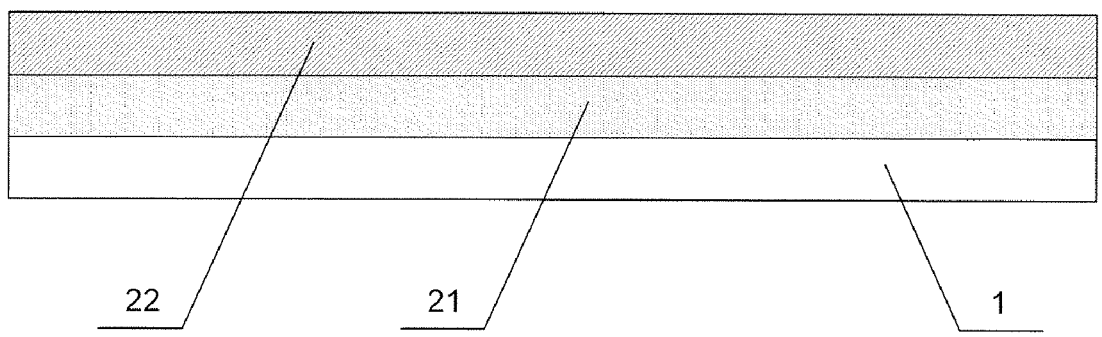
FIG. 15 is a schematic view after depositing a transparent conductive film and a gate metal film in a first patterning process according to a second embodiment of a method of manufacturing a TFT-LCD array substrate of the present invention.
Figure 16:
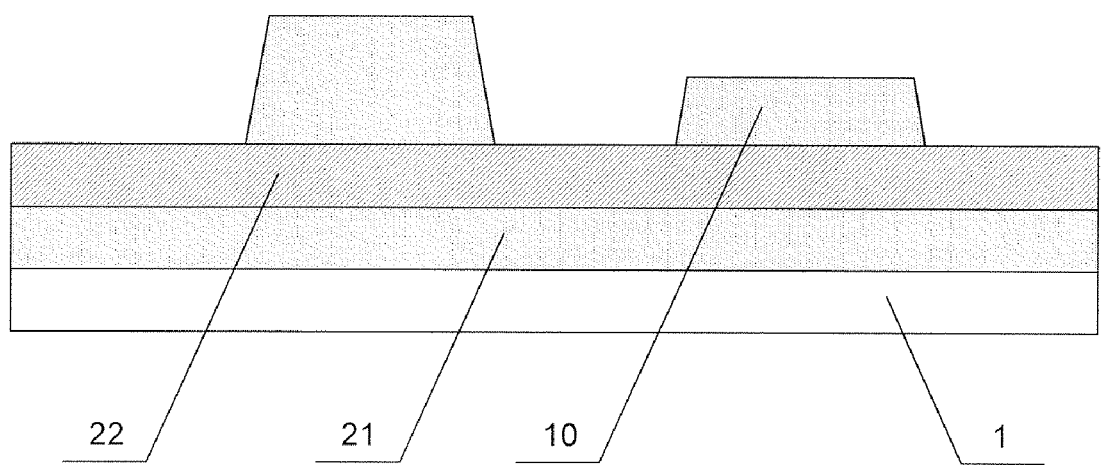
FIG. 16 is a schematic view after an exposing and developing process in the first patterning process according to the second embodiment of the method of manufacturing a TFT-LCD array substrate of the present invention.
Figure 17:
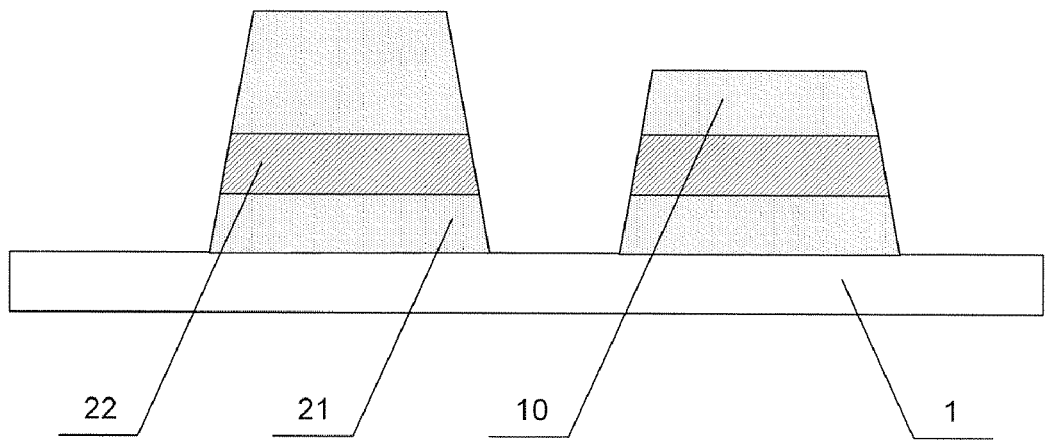
FIG. 17 is a schematic view after a first etching in the first patterning process according to the second embodiment of the method of manufacturing a TFT-LCD array substrate of the present invention.

FIG. 15 is a schematic view after depositing a transparent conductive film and a gate metal film in a first patterning process according to the second embodiment of the method of manufacturing a TFT-LCD array substrate. As shown in FIG. 15, a transparent conductive film 21 and a gate metal film 22 are deposited in this order on a substrate (e.g., a glass substrate or a quartz substrate) 1. For example, the transparent conductive film 21 may be formed of indium tin oxide (ITO), indium zinc oxide (IZO) or the like. The gate metal film may be a single layer of molybdenum, aluminum, aluminum neodymium alloy, tungsten, chromium, copper or the like or a multilayer of two or more metals selected form above-mentioned metals. FIG. 16 is a schematic view after an exposing and developing process in the first patterning process according to the second embodiment of the method of manufacturing a TFT-LCD array substrate. A photoresist layer 10 is applied on the substrate 1 and an exposing process is performed with a gray tone mask or a half-tone mask so that the photoresist layer is formed into a first exposed region, a second exposed region, and a third exposed region. The first exposed region is an un-exposed region and corresponds to the region where the gate electrode is to be formed; the second exposed region is a partially exposed region and corresponds to the region where the transparent common electrode is to be formed; and the third exposed region is a completely exposed region and corresponds to the region other than the regions of the gate electrode, the gate line and the transparent common electrode. Then, the thickness of the photoresist in the three exposed regions is changed by a developing process to be different from each other. Specifically, the thickness of the photoresist in the first exposed region is the largest; the thickness of the photoresist in the second exposed region is reduced; and the photoresist in the third exposed region is completely removed, as shown in FIG. 16. FIG. 17 is a schematic view after a first etching in the first patterning process according to the second embodiment of the method of manufacturing a TFT-LCD array substrate. As shown in FIG. 17, the transparent conductive film 21 and the gate metal film 22 that are exposed through the photoresist are removed by the first etching.

Figure 18:
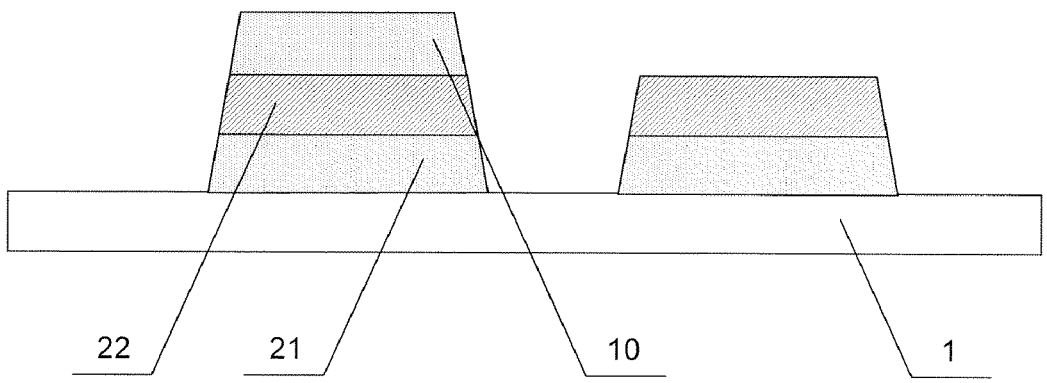
FIG. 18 is a schematic view after an ashing process in the first patterning process according to the second embodiment of the method of manufacturing a TFT-LCD array substrate of the present invention.
Figure 19:
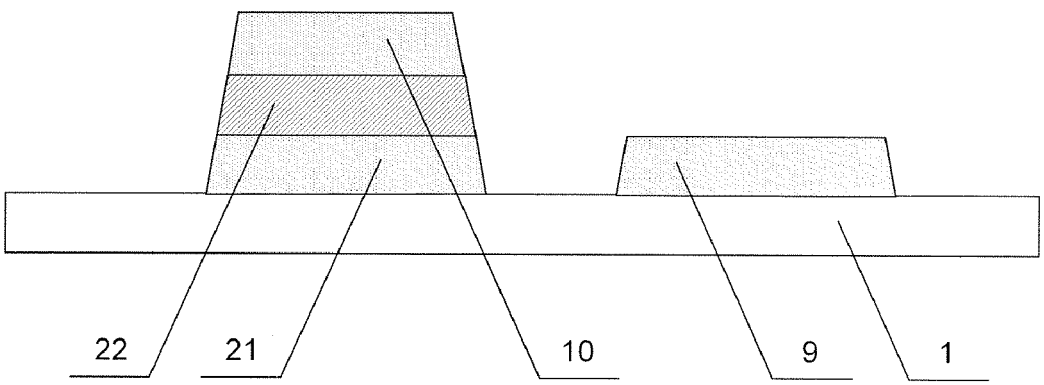
FIG. 19 is a schematic view after a second etching in the first patterning process according to the second embodiment of the method of manufacturing a TFT-LCD array substrate of the present invention.

FIG. 18 is a schematic view after an ashing process in the first patterning process according to the second embodiment of the method of manufacturing a TFT-LCD array substrate. As shown in FIG. 18, the photoresist in the partially exposed region is completely removed by the ashing process. FIG. 19 is a schematic view after a second etching in the first patterning process according to the second embodiment of the method of manufacturing a TFT-LCD array substrate. As shown in FIG. 19, the gate metal film 22 exposed through the photoresist is removed by the second etching to form the transparent common electrode 9.

Figure 20:
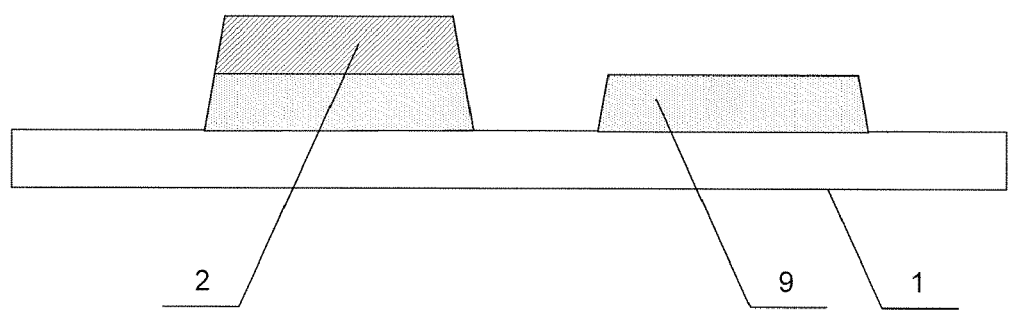
FIG. 20 is a schematic view after a lifting-off process in the first patterning process according to the second embodiment of the method of manufacturing a TFT-LCD array substrate of the present invention.

FIG. 20 is a schematic view after a lifting-off process in the first patterning process according to the second embodiment of the method of manufacturing a TFT-LCD array substrate. The remained photoresist is removed by the lifting-off process to form the gate line and gate electrode 2 on the transparent conductive film, as shown in FIG. 20.

Figure 21:
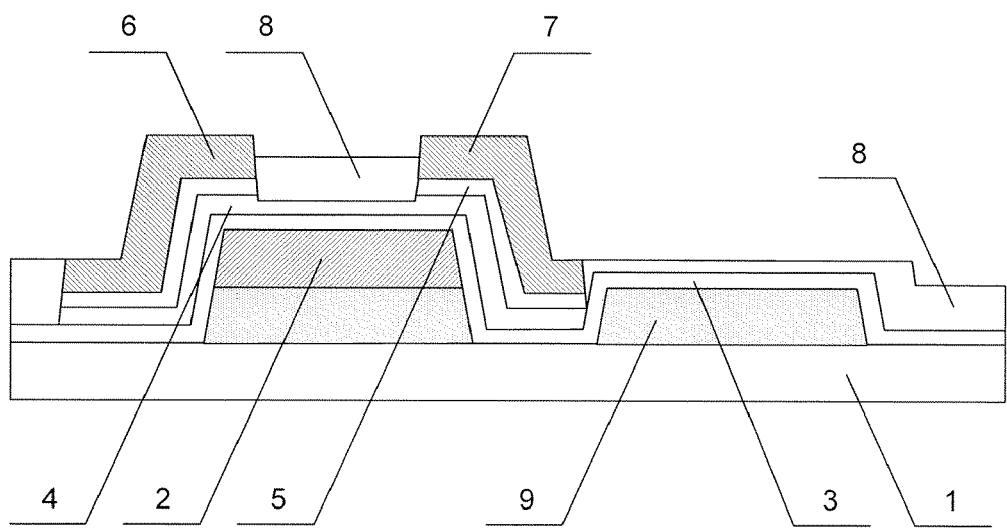
FIG. 21 is a schematic view after a second patterning process according to the second embodiment of the method of manufacturing a TFT-LCD array substrate of the present invention.

FIG. 21 is a schematic view after a second patterning process according to the second embodiment of the method of manufacturing a TFT-LCD array substrate.

A gate insulating layer 3, a semiconductor layer 4, a doped semiconductor layer (i.e., an ohmic contact layer) 5, and a metal film for source and drain electrodes are deposited in this order on the substrate with the above-mentioned patterns. The semiconductor layer, the doped semiconductor layer and the metal film for source and drain electrodes are patterned with a gray tone mask or a half-tone mask by the second patterning process so that a data line, a source electrode 6, a drain electrode 7 and a TFT channel region are formed on the substrate. The pattern of the active layer is formed above the gate electrode 2. The doped semiconductor layer between the source electrode 6 and the drain electrode 7 is completely removed to expose the semiconductor layer therebetween, and the gate insulating layer is exposed in other regions. The photoresist on the source electrode 6, the drain electrode 7 and the data line is remained. Then, a passivation layer 8 is deposited for example by a chemical vapor deposition method or the like to cover the TFT channel region. The remained photoresist along with the passivation layer thereon is removed by a lifting-off process so that the source electrode, the drain electrode and the data line are exposed, as shown in FIG. 21. In addition, the method of forming a photoresist burr edge in the embodiments may be employed to form a photoresist burr edge before depositing the passivation layer in order that the remained photoresist along with the passivation layer thereon can be removed easily.

Figure 22:
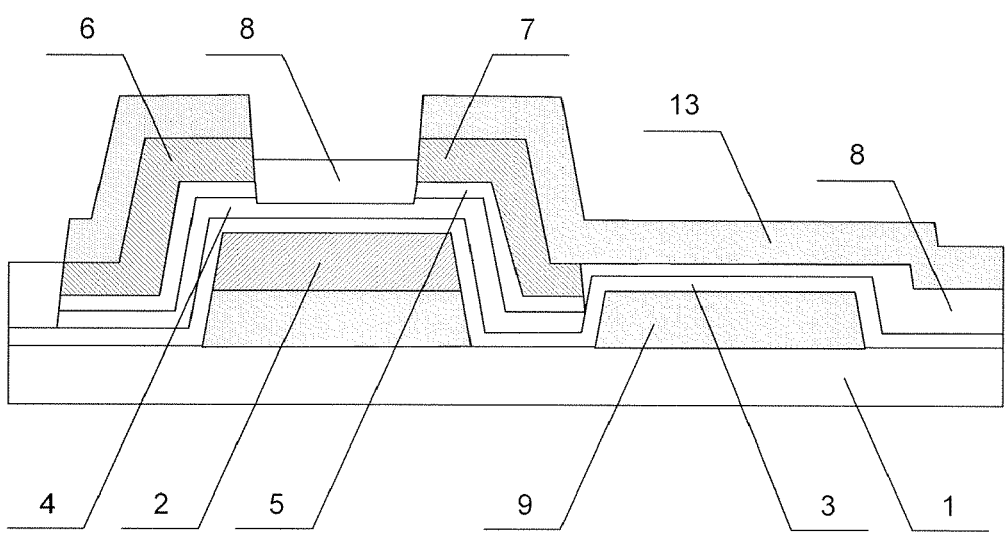
FIG. 22 is a schematic view after a third patterning process according to the second embodiment of the method of manufacturing a TFT-LCD array substrate of the present invention.

FIG. 22 is a schematic view after a third patterning process according to the second embodiment of the method of manufacturing a TFT-LCD array substrate. A photoresist layer is deposited and then a photoresist burr edge is formed. A transparent conductive film is then deposited on the above patterned photoresist. Due to the photoresist burr edge, the transparent conductive film is disconnected at the protrusion of the photoresist burr edge. Finally, the remained photoresist and the transparent conductive film thereon are removed by a lifting-off process so that the pixel electrode 13 is formed on the substrate. As shown in FIG. 22, the pixel electrode 13 and the drain electrode 8 are directly connected with each other. The second and third patterning processes in the present embodiment are identical with those in the first embodiment, and the details thereof are not explained again for simplicity.

Figure 23:
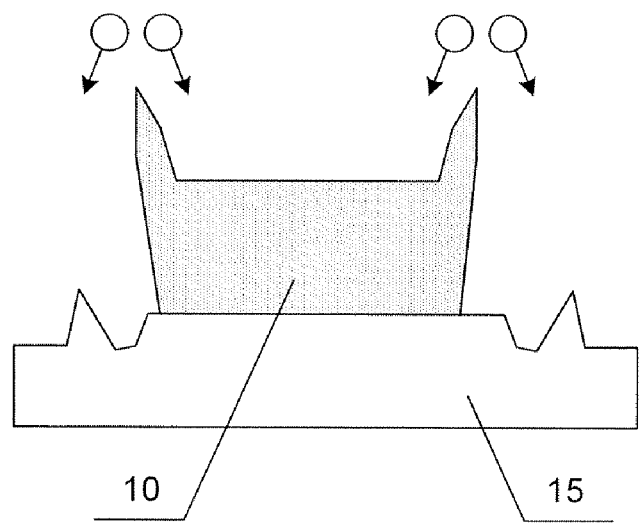
FIG. 23 to FIG. 25 are schematic views showing lifting-off results during manufacturing a TFT-LCD array substrate of the present invention.
Figure 24:
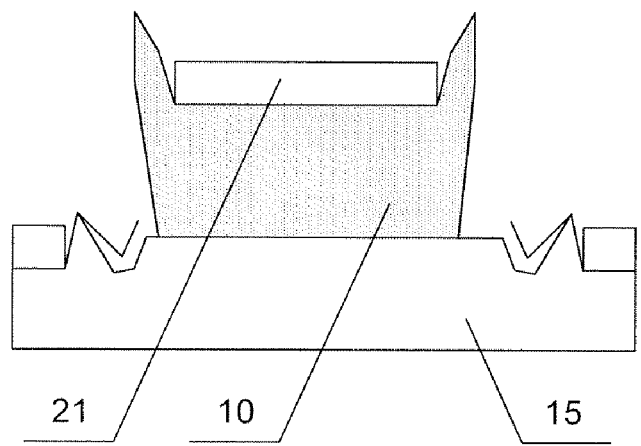
Figure 25:
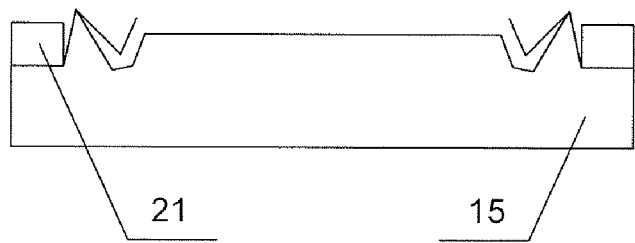

FIG. 23 to FIG. 25 are schematic views showing lifting-off results during manufacturing a TFT-LCD array substrate of the present invention. According to the above embodiments of the method of manufacturing a TFT-LCD array substrate, the plasma etching in the ashing process may be helpful to the implement of the lifting-off process in the third patterning process of forming the pixel electrode. Specifically, the photoresist burr edge may consume the plasma, and thereby a concavo-convex structure is formed on the substrate 15 at the bottom of the photoresist burr edge by the plasma etching in the ashing process, as shown in FIG. 23. Then, as shown in FIG. 24, when the transparent conductive film 21 is deposited, it can be disconnected at the concavo-convex structure, which is helpful not only to the permeation of the lifting-off liquid but also to the lifting-off of the photoresist and the transparent conductive film thereon. Therefore, the photoresist lifting-off quality is farther improved, as shown in FIG. 25.

A method of manufacturing a TFT-LCD array substrate is provided in the present invention. In this method, the gate line and the gate electrode are firstly formed by the first patterning process; then the data line, the source electrode, the drain electrode and the TFT channel region are formed with a gray tone mask or a half-tone mask by the second patterning process without removing the photoresist on the source electrode, the drain electrode and the data line. The remained photoresist is removed together with the passivation layer to be subsequently deposited. Finally the photoresist burr edge is formed with a half-tone mask, a gray-tone mask or a normal mask, and the transparent conductive film is disconnected at the protrusion of the photoresist burr edge to form the pixel electrode. Due to the photoresist burr edge formed in the third patterning process, the transparent conductive film is disconnected at the photoresist burr edge, which is helpful not only to the permeation of the lifting-off liquid but also to the lifting-off of the photoresist and the transparent conductive film thereon. Therefore, the photoresist lifting-off quality is improved. Furthermore, the method provided in the present invention is simple, reliable and easy to carry out, and thus has a wide application prospect. In addition, in the present embodiment, the pixel electrode is directly connected with the drain electrode so that the electrical connection therebetween is improved, and the pixel electrode covers the corresponding electrode so that the circuit is effectively protected and the production yield is improved.

Furthermore, a TFT-LCD array substrate as shown in FIG. 13 and FIG. 14 is provided in the embodiment of the present invention. The TFT-LCD array substrate comprises a plurality of gate lines 11 and a plurality of data lines 12 perpendicular to the gate lines 11 that are insulated from each other and formed on a substrate 1, a plurality of pixel units defined by intersection between the gate lines 11 and the data lines 12, thin film transistors (TFTs) 13 each formed at the intersection of each pixel unit, and pixel electrodes 13 each formed in each pixel unit. The thin film transistor comprises a gate electrode 2 on the substrate 1, a gate insulating layer 3 on the gate electrode 2 and covering the entire substrate, a semiconductor layer 4 and a doped semiconductor layer 5 on the gate insulating layer 3, a source electrode 6 and a drain electrode 7 on the doped semiconductor layer 5, a TFT channel region between the source electrode 6 and the drain electrode 7, and a passivation layer 8 formed in the region other than the regions of the data line 12, the source electrode 6 and the drain electrode 7 (that is, the source electrode 6, the drain electrode 7 and the data line 12 do not formed in the region of the passivation layer 8). In the TFT-LCD array substrate of the present embodiment, the pixel electrode 13 is connected with the drain electrode 7, the gate electrode 12 is connected with the gate line 11, and the source electrode 6 is connected with the data line 12. Therefore, a TN mode TFT-LCD array substrate is obtained.

In addition, the TFT-LCD in the embodiment of the present invention may further comprise a transparent common electrode 9 formed on the substrate 1 and a transparent conductive film formed below the gate electrode 2 and the gate line 11. Therefore, an FFS mode TFT-LCD array substrate is formed.

The TN mode and FFS mode TFT-LCD array substrate may be manufactured by using the first and second embodiments of manufacturing a TFT-LCD array substrate of the present invention, respectively, and the structural details thereof are not explained again for simplicity.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method of forming a photoresist burr edge comprising:
    applying a photoresist layer on a substrate;
    forming a first thickness region, a second thickness region, and a third thickness region of the photoresist layer by exposing the photoresist layer with a gray tone mask or a half-tone mask and then developing the exposed photoresist layer, wherein the first thickness region, the second thickness region, and the third thickness region are integrally connected, and the first thickness region is between the second thickness region and the third thickness region, wherein the first thickness region has a photoresist ridge upwardly projected on the photoresist layer and corresponds to the region where a photoresist burr edge is to be formed, the second thickness region of the photoresist layer corresponds to the region where no structural pattern is to be formed, and the third thickness region corresponds to the region where a structural pattern is to be formed; and
    immediately following the developing of the exposed photoresist layer to obtain the first thickness region, the second thickness region, and the third thickness region, performing an ashing process on the developed photoresist layer for forming the photoresist burr edge of peak shape in the first thickness region, remaining the photoresist in the second thickness region and completely removing the photoresist in the third thickness region.

2. The method according to claim 1, wherein the applying of the photoresist layer on the substrate comprises applying the photoresist with a thickness of about 1.8 µm to about 2.2 µm on the substrate.

3. The method according to claim 1, wherein the first thickness region corresponds to the region with a transmissivity of about 0% of the gray-tone mask or half-tone mask, the second thickness region corresponds to the region with a transmissivity of about 10% to 40% of the gray-tone mask or half-tone mask, and the third thickness region corresponds to the region with a transmissivity of about 60% to 90% of the gray-tone mask or half-tone mask.

4. The method according to claim 1, wherein the forming of the first thickness region, the second thickness region, and the third thickness region comprises forming the first thickness region, the second thickness region and the third thickness region of the photoresist layer by exposing with the gray-tone mask or a half-tone mask and developing,
    wherein the photoresist ridge is formed in the first thickness region and the first thickness region has a thickness of about 1.8 µm to about 2.2 µm and corresponds to the region where the photoresist burr edge is to be formed, the second thickness region of the photoresist layer has a thickness of about 1.3 µm to about 1.6 µm and corresponds to the region where no structural pattern is to be formed, and the third thickness region has a thickness of about 0.4 µm to about 0.6 µm and corresponds to the region where a structural pattern is to be formed.

5. The method according claim 1, wherein the forming the photoresist burr edge comprises forming the photoresist burr edge of peak shape in the first thickness region, remaining the photoresist in the second thickness region to have a thickness of about 0.9 µm to about 2.2 µm, and completely removing the photoresist in the third thickness region by an ashing process.

6. A method of forming a photoresist burr edge comprising:
    applying a photoresist layer on a substrate; and exposing the photoresist layer with a normal mask and then developing the exposed photoresist layer to form a completely remained region and a completely removed region of the photoresist layer by, wherein the completely remained region corresponds to the region where no structural pattern is to be formed, and the completely removed region corresponds to the region where a structural pattern is to be formed and the photoresist in the completely removed region is removed completely; and
    immediately following the developing of the exposed photoresist layer to obtain the completely remained region and the completely removed region of the photoresist layer, dry-etching the developed photoresist layer by using double frequency plasma mode and setting the etching rate to be higher at a central portion of the completely remained region of the photoresist layer and to be lower at an edge portion of the completely remained region of the photoresist layer, so that forming a photoresist burr edge of peak shape at the edge portion of the completely remained region of the photoresist layer and upwardly projected on the formed photoresist pattern.

* * * * *